United States Patent [19]
Stoops

[11] Patent Number: 5,841,286
[45] Date of Patent: Nov. 24, 1998

[54] OSCILLOSCOPE WITH DETECTION OF ANOMALOUS EVENTS DURING BLIND INTERVALS

[75] Inventor: John F. Stoops, Portland, Oreg.

[73] Assignee: Tektronix, Inc., Wilsonville, Oreg.

[21] Appl. No.: 390,907

[22] Filed: Feb. 17, 1995

Related U.S. Application Data

[63] Continuation of Ser. No. 88,969, Jul. 7, 1993, abandoned.
[51] Int. Cl.$^6$ ............................. G01R 31/28; G01R 13/20
[52] U.S. Cl. .................. 324/511; 324/76.12; 324/121 R; 364/487
[58] Field of Search ............................. 324/76.12, 76.13, 324/121 R, 511, 522, 523, 76.16, 76.18; 340/825.04, 754; 364/486, 487

[56] References Cited

U.S. PATENT DOCUMENTS

| | | | |
|---|---|---|---|
| 4,072,851 | 2/1978 | Rose | 324/121 R |
| 4,495,642 | 1/1985 | Zellmer | 364/487 |
| 4,670,711 | 6/1987 | Daniels | 324/76.16 |
| 4,763,067 | 8/1988 | Fladstol | 324/121 R |
| 4,901,009 | 2/1990 | Schultze et al. | 324/121 R |
| 4,975,636 | 12/1990 | Desautels | 324/121 R |
| 5,003,248 | 3/1991 | Johnson | 324/121 R |
| 5,043,927 | 8/1991 | Jackson | 364/551.01 |
| 5,123,034 | 6/1992 | Grujon | 324/121 R |
| 5,160,892 | 11/1992 | Makhija et al. | 324/379 |
| 5,250,935 | 10/1993 | Jonker et al. | 324/379 |

*Primary Examiner*—Kenneth A. Wieder
*Assistant Examiner*—Glenn W. Brown
*Attorney, Agent, or Firm*—John Smith-Hill; Boulden G. Griffith

[57] ABSTRACT

An oscilloscope comprises a trigger circuit for initiating display of the waveform of an input signal in response to a trigger event, at least one detection circuit responsive to the input signal for detecting occurrence of an anomalous event therein, and a counter for reporting the number of occurrences of the anomalous event that have been detected.

8 Claims, 2 Drawing Sheets

OSCILLOSCOPE WITH DETECTION OF ANOMALOUS EVENTS DURING BLIND INTERVALS

This is a continuation of application Ser. No. 08/088,969 filed Jul. 7, 1993 which is now abandoned.

BACKGROUND OF THE INVENTION

This invention relates to an oscilloscope architecture providing detection of anomalous events, particularly detection of such events during blind intervals.

In a conventional analog real time oscilloscope, a trigger circuit detects a trigger event of an input signal and enables a display device such as a cathode-ray tube (CRT) to display a waveform of the signal during a sweep interval that follows the trigger event. Retrace and holdoff intervals follow the sweep interval, during which time the display device is disabled and blanked such that the oscilloscope is not able to display the signal's waveform. Therefore, an anomalous event that occurs during the blind interval, composed of the retrace interval and the holdoff interval, is not displayed by the analog real time oscilloscope.

In a digital storage oscilloscope, occurrence of a trigger event initiates an acquisition interval, during which the input signal is sampled and the samples resulting therefrom are stored in memory. In order to display the waveform of the signal, the samples are processed and applied to a vertical deflection circuit under control of a clock signal, which clock signal also drives a horizontal deflection circuit. During the processing and display times, the oscilloscope is unable to sample the input signal, and accordingly an anomalous event that occurs during this blind interval is not detected. In a typical analog real time oscilloscope, the blind interval time is at least one tenth of the sweep interval, and in a digital storage oscilloscope, when set to acquire a high frequency signal, the blind interval may be several times the duration of the acquisition interval.

It is known to produce a trigger circuit responsive to any one of several types of anomalous events, including narrow pulses or glitches, pulses that are lower than expected (runt pulses), a rise time or fall time that is slower that expected, and a positive or negative peak that is outside an expected range. Thus, an oscilloscope can be set to detect any one of these anomalous events and generate a trigger for initiating a subsequent measurement interval or acquisition.

For a sensitive electronic circuit being affected by a given signal, a particular anomalous event of the given signal might cause the electronic circuit or a component thereof to fail. Unfortunately, if the particular anomalous event occurs rather infrequently, it can be very difficult to reliably detect the anomalous event using a conventional oscilloscope. And although an oscilloscope can be set to detect a single anomalous event, i.e. when in single shot trigger mode, once the anomalous event occurs, the oscilloscope triggers and indicates occurrence of the anomalous event but will not report subsequent occurrences.

SUMMARY OF THE INVENTION

In accordance with a first aspect of the present invention there is provided an oscilloscope comprising at least one detection circuit responsive to an input signal for detecting occurrence of an anomalous event therein, and a means for reporting the number of occurrences of the anomalous event that have been detected.

In accordance with a second aspect of the present invention there is provided an oscilloscope comprising a trigger circuit for initiating display of the waveform of an input signal in response to a trigger event, and at least one detection circuit responsive to the input signal for detecting occurrence of an anomalous event therein during a blind interval of a measurement cycle of the oscilloscope.

In accordance with a third aspect of the present invention there is provided an oscilloscope comprising a display device having a waveform area and a histogram area, at least one peak detector for detecting a peak amplitude of an input signal during a blind interval of a measurement cycle of the oscilloscope, and a means for providing in the histogram area a display indicating the distribution of detected peak amplitude values.

In accordance with a fourth aspect of the present invention there is provided a measurement instrument comprising a trigger circuit for initiating a measurement acquisition of an input signal in response to a trigger event, and at least one detection circuit responsive to the input signal for detecting occurrence of an anomalous event therein, said anomalous event being different from said trigger event.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
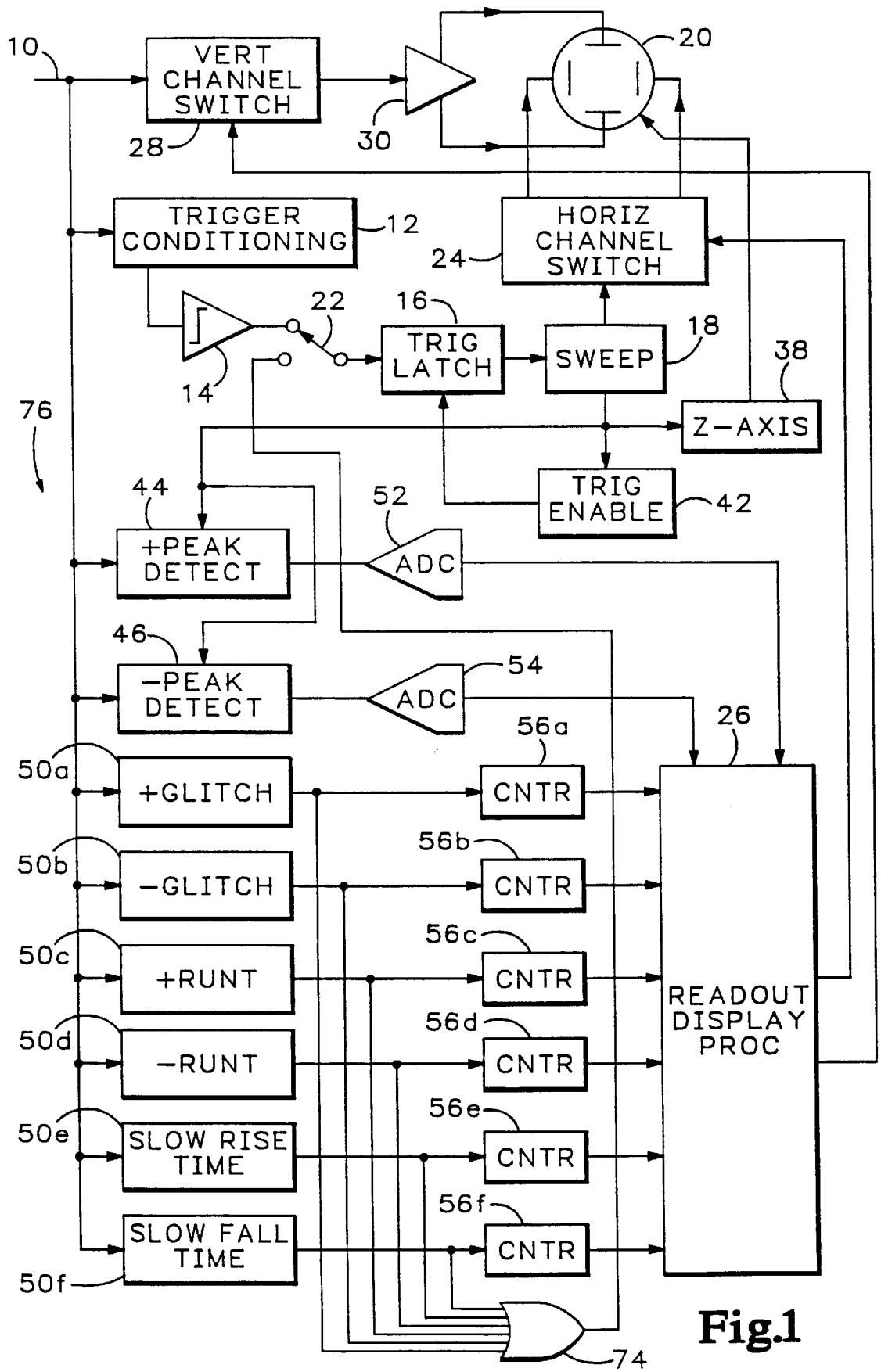
FIG. 1 is a block diagram of an oscilloscope embodying the present invention.
Figure 2:
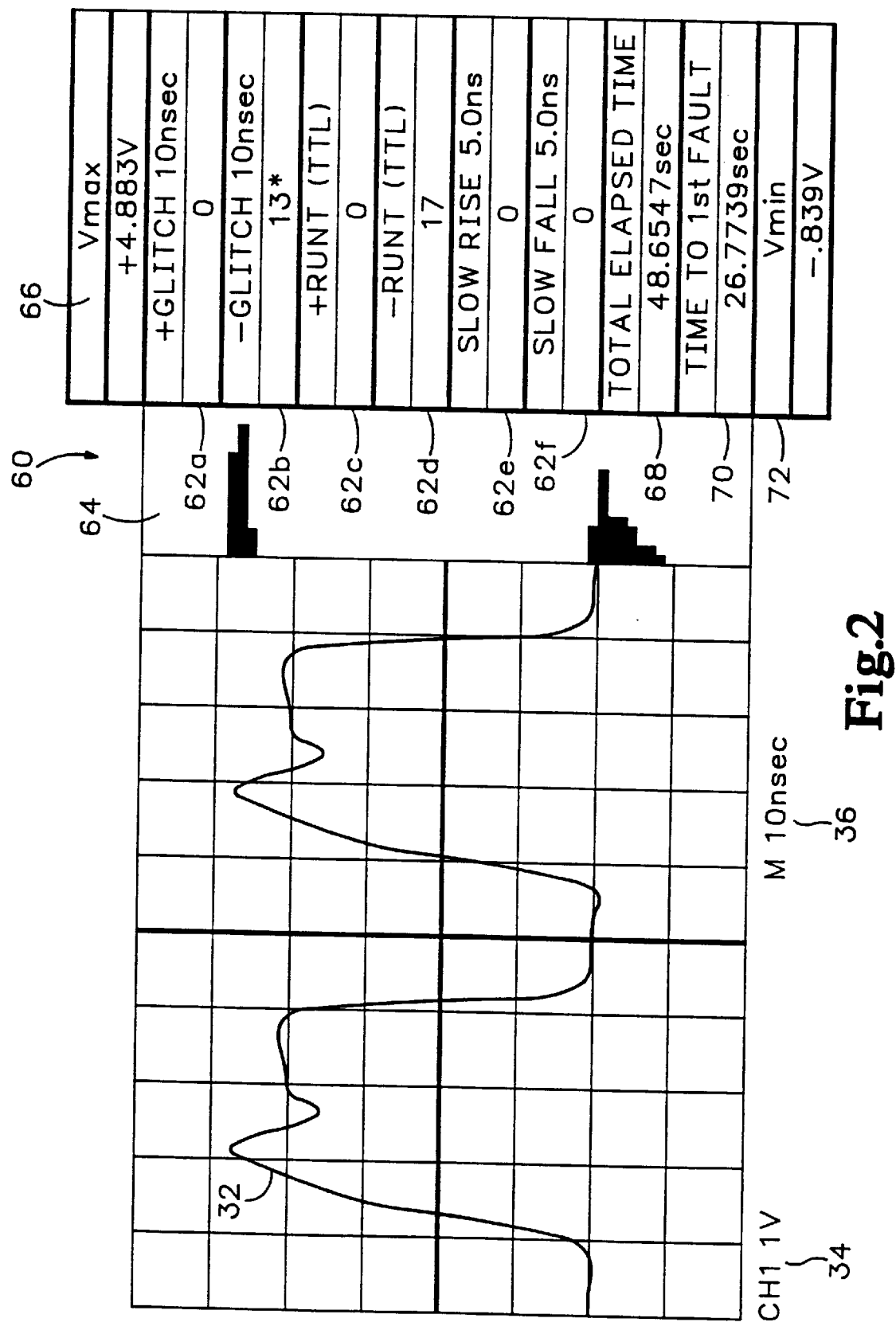
FIG. 2 illustrates a typical display provided by the oscilloscope shown in FIG. 1.

The oscilloscope shown in FIG. 1 is an analog real time oscilloscope and has an input terminal 10 for receiving an input signal, e.g. from a device under test. In conventional applications, the input signal is applied through a trigger conditioning circuit 12 to a trigger comparator 14, which provides an output signal when the conditioned input signal passes in a predetermined direction through a selected threshold level. The trigger signal is applied through a switch 22 to a trigger latch 16, which provides a signal to a sweep circuit 18 to initiate a horizontal sweep of the electron beam of a CRT 20. The sweep signal is applied to the horizontal deflection plates of the CRT through a horizontal channel switch 24, which is also selectively responsive to horizontal readout signals provided by a readout display processor 26. The readout display processor 26 also provides vertical readout signals to a vertical channel switch 28, which selects between the vertical readout signals and the input signal. The output of the vertical channel switch is provided to the vertical deflection plates of the CRT 20 through a vertical amplifier 30. The signals provided by the readout display processor 26 allow the CRT 20 to display not only the waveform 32 of the input signal but also alphanumeric characters 34, 36 (FIG. 2) describing, for example, the settings of the oscilloscope. The sweep circuit 18 also provides an output to a Z axis module 38, which controls blanking and unblanking of the electron beam, and a trigger enable circuit 42, which resets the latch 16 after a given delay following an end-of-sweep signal and allows the latch to accept another trigger.

As described thus far, the oscilloscope shown in FIG. 1 operates in conventional fashion, in that it provides a display of the waveform of the input signal during the sweep interval and does not provide information regarding events outside the sweep interval.

The input terminal 10 of the oscilloscope shown in FIG. 1 is also connected to a signal characterizing and monitoring subsystem 76 that comprises positive and negative peak detectors 44 and 46 and six anomalous event detectors 50a–50f. The peak detectors 44 and 46 are of conventional form and are each disabled during the sweep interval. The peak detectors detect the positive and negative peaks respectively during the blind interval of each operating cycle of the oscilloscope. The detected peak values are read out from the peak detectors while the peak detectors are disabled, and the peak detectors are then reset, before the beginning of the next blind interval. The positive and negative peak values are applied to respective analog-to-digital converters (ADCs) 52 and 54 and the outputs of the ADCs are applied to the readout display processor 26.

The anomalous event detectors 50a and 50b detect positive and negative glitches, the detectors 50c and 50d detect positive and negative runt pulses, and the detectors 50e and 50f detect slow rise and fall times. Each of these detectors may be implemented in similar manner to the circuit used in a conventional oscilloscope for glitch, runt and slow rise time triggering. When one of the detectors 50a–50f detects an anomalous event, it increments a counter 56a–56f. The outputs of the counters are provided to the readout display processor. The readout display processor 26 causes the electron beam of the CRT 20 to address a data readout display area 60 (FIG. 2) and to write information in fields 62a–62f and 64–72 of the display area 60.

When using the oscilloscope, an operator may select minimum duration thresholds for glitches, minimum amplitude thresholds for runt pulses and maximum duration thresholds for rise and fall times. If the input signal includes a glitch (positive or negative) of duration less than the minimum threshold value, it is detected by the glitch detector 50a or 50b, the counter 56a or 56b is incremented, and the new count is provided to the readout display processor. Upon receiving the new count, the readout display processor updates the display to indicate in the display field 62a or 62b that an additional glitch has been detected. Similarly, if a runt pulse (positive or negative) of amplitude less than the selected minimum threshold is detected, the counter 56c or 56d is incremented and the display updated in the field 62c or 62d. Yet again, if the rise or fall time of a transition is greater than the respective maximum duration threshold, occurrence of this event is detected, the counter 56e or 56f is incremented, the new count is reported to the readout display processor, and the display is updated in the field 62e or 62f.

During the blind interval of each operating cycle of the oscilloscope, the peak detectors 44 and 46 provide analog peak values to the ADCs 52 and 54, which digitize the analog peak values and provide the resulting digital values to the readout display processor 26. In a preferred embodiment, the ADCs 52 and 54 quantize at a resolution of eight units per vertical division of the CRT display, and the readout display processor receives and records each occurrence of a peak in each quantization interval and accumulates a count for each quantization interval. As a record accumulates, the readout display processor generates histograms in the display area 64 indicating the distribution of the positive and negative peak values received.

Although the peak detectors 44, 46 are able to acquire peak values only during the blind interval that follows the active sweep interval associated with a given trigger event, it is preferred that the anomalous event detectors 50 operate during both the active sweep interval and the blind interval. Therefore, if a glitch, runt pulse or slow rise or fall time event occurs during the blind interval, it is detected by the appropriate detector, recorded and subsequently reported by an updated data readout display in the display area 60

The range of voltage values encompassed by the histogram display area is the same as that of the waveform display area. Therefore, if a new maximum positive peak value or new minimum negative peak value occurs, and it is outside the voltage range of the waveform display, it is not reported positively in the histogram display area. However, the data readout display area includes fields 66, 72 for displaying maximum and minimum voltage values. Each time a new maximum positive peak value or minimum negative peak value is attained, the field 66 or 72 is updated to reflect the new value. Therefore, if the new positive or negative peak is outside the voltage range that is displayed, this event is nevertheless reported and can be observed by the user.

Finally, the readout display processor includes a clock for reporting in the fields 68 and 70 the total elapsed time of a particular test and the time that elapsed up to the first anomalous event.

Preferably, as also shown in FIG. 1, the outputs of the detectors 50 are also connected to respective inputs of an OR gate 74. The output of the OR gate 74 is an event detected output of the signal characterizing and monitoring subsystem 76 and is connected to a second terminal of the switch 22. In the event that the switch 22 selects the output of the OR gate 74, the output of the OR gate constitutes the trigger input to the trigger latch 16, so that the first anomalous event initiates a sweep of the CRT and causes the CRT to provided a display of the waveform of the input signal immediately after the first anomalous event. If a delay line is included between the input terminal 10 and the vertical channel switch 28, the oscilloscope is able to display the anomalous event. This feature is particularly applicable to a direct view storage oscilloscope, since it allows the user to observe the anomalous event at a later time.

It will be appreciated that the invention is not restricted to the particular embodiments that have been described, and that variations may be made therein without departing from the scope of the invention as defined in the appended claims and equivalents thereof. For example, the invention is not restricted to use with an analog real time oscilloscope and is applicable also to a digital storage oscilloscope. Further, the invention is not restricted to the use of detectors for detecting the particular anomalous events that have been discussed, and in a particular application one or more of the detectors 50a–50f may be omitted, and detectors for responding to other anomalous events may be provided in addition to, or in lieu of, one or more of the detectors 50a–50f. For example, a timing comparison circuit responsive both to the signal at the terminal 10 and a second signal may be provided to detect and report events such as set-up and hold violations. Moreover, although FIG. 1 suggests application of the invention to a single channel oscilloscope, the invention may also be applied to a multi-channel oscilloscope. In this case, each channel of the oscilloscope may be provided with a signal monitoring and characterizing subsystem. If the signal monitoring and characterizing subsystem includes a timing comparison circuit, as mentioned above, the second signal that is applied to a given timing comparison circuit may be the input signal of another channel or an external signal. Assuming that each signal characterizing and monitoring subsystem provides an event detected output similar to that provided by the OR gate 74 of FIG. 1, the several event detected outputs may be ORed to provide for triggering on the first anomalous event detected by any of the signal characterizing and monitoring subsystems.

I claim:

1. An oscilloscope comprising:

a trigger circuit connected to detect a trigger event in the input signal for initiating display of a waveform of an input signal in response to the trigger event, the trigger event being the occurrence of a predefined behavior of the input signal, display means for displaying the waveform in response to the initiation of the trigger circuit, at least one detection circuit independent of the trigger circuit and responsive to the input signal for detecting occurrence of an anomalous event in the input signal during a blind interval of a measurement cycle of the oscilloscope, the blind interval being an interval during which the oscilloscope is unable to process the input signal to produce a waveform display, and means for responding to the occurrence of the anomalous event by either recording the occurrence of the anomalous event or communicating the occurrence of the anomalous event to an operator.

2. An oscilloscope according to claim 1, wherein said oscilloscope comprises control means for operating the oscilloscope in accordance with a measurement cycle comprising sequentially an active interval and the blind interval, wherein the active interval plus the blind interval form a detection interval during which the detection circuit is responsive to the input signal.

3. An oscilloscope according to claim 1, wherein the means for responding to the occurrence of the anomalous event comprises means for providing a display indicating that the anomalous event has been detected.

4. An oscilloscope according to claim 1, wherein the trigger circuit includes a trigger latch that is connected to respond to detection of an anomalous event by said detection circuit.

5. An oscilloscope according to claim 1, further comprising a peak detector means responsive to the input signal for detecting peaks thereof.

6. An oscilloscope according to claim 1, comprising a plurality of detection circuits for detecting at least two anomalous events selected from the group consisting of glitches, runt pulses, rise times longer than a selected value, and fall times longer than a selected value.

7. An oscilloscope according to claim 6, wherein the trigger circuit includes a trigger latch and means for connecting the trigger latch to respond to detection of an anomalous event by any of the detection circuits.

8. An oscilloscope according to claim 1, wherein the detection circuit is responsive to an anomalous event that is different from the trigger event.

* * * * *